US012066306B1

(12) United States Patent
Buentello et al.

(10) Patent No.: US 12,066,306 B1
(45) Date of Patent: Aug. 20, 2024

(54) SYSTEMS AND METHODS FOR PROACTIVE MONITORING THROUGH SMART COATINGS

(71) Applicant: United Services Automobile Association (USAA), San Antonio, TX (US)

(72) Inventors: Andre Rene Buentello, San Antonio, TX (US); Nathan Lee Post, Rockport, TX (US); Justin Royell Nash, Little Elm, TX (US); Gregory David Hansen, Fuquay Varina, NC (US); Jose L Romero, Jr., San Antonio, TX (US); Brian Francisco Shipley, Plano, TX (US)

(73) Assignee: United Services Automobile Association (USAA), San Antonio, TX (US)

( * ) Notice: Subject to any disclaimer, the term of this patent is extended or adjusted under 35 U.S.C. 154(b) by 0 days.

(21) Appl. No.: 17/875,894

(22) Filed: Jul. 28, 2022

Related U.S. Application Data

(60) Provisional application No. 63/227,713, filed on Jul. 30, 2021.

(51) Int. Cl.
  *G01D 5/24* (2006.01)
  *G01D 5/14* (2006.01)
  *G01R 27/26* (2006.01)

(52) U.S. Cl.
  CPC .......... *G01D 5/24* (2013.01); *G01R 27/2605* (2013.01); *G01D 5/14* (2013.01); *G01R 27/26* (2013.01)

(58) Field of Classification Search
  CPC ........ G01R 27/00; G01R 27/02; G01R 27/26; G01R 27/2605; G01D 5/00; G01D 5/12; G01D 5/14; G01D 5/24
  USPC ................................ 600/600, 649, 658, 686
  See application file for complete search history.

(56) References Cited

U.S. PATENT DOCUMENTS

| 7,123,031 | B2 * | 10/2006 | Twerdochlib ............ | G01B 7/18 324/71.2 |
| 7,141,990 | B2 * | 11/2006 | Bast ..................... | G01N 33/388 324/708 |
| 7,701,231 | B2 * | 4/2010 | Yonushonis ....... | B01D 46/0086 324/718 |
| 7,723,998 | B2 * | 5/2010 | Doi ........................ | H01L 27/02 324/555 |
| 9,285,402 | B1 * | 3/2016 | Emery ................... | G01R 27/16 |

FOREIGN PATENT DOCUMENTS

| ES | 2381723 A1 * | 5/2012 | ......... G01N 21/8806 |

* cited by examiner

*Primary Examiner* — Hoai-An D. Nguyen
(74) *Attorney, Agent, or Firm* — Fletcher Yoder, P.C.

(57) ABSTRACT

The presently described systems and techniques enable computers to discern impacts and structural weaknesses in objects in a new and cost-effective manner. As capacitive changes (e.g., mutual capacitance between rows or columns of smart coatings) occur in the smart coatings, contact with the object and/or structural weaknesses of the object may be identified, enabling electronic notification and/or action to occur in response to the contact and/or structural weakness.

17 Claims, 6 Drawing Sheets derstood upon reading the following detailed description and
SYSTEMS AND METHODS FOR PROACTIVE MONITORING THROUGH SMART COATINGS

CROSS-REFERENCE TO RELATED APPLICATION

This application claims priority to and the benefit of U.S. Provisional Patent Application No. 63/227,713, entitled "SYSTEMS AND METHODS FOR PROACTIVE MONITORING THROUGH SMART COATINGS", filed Jul. 30, 2021, which is herein incorporated by reference in its entirety.

BACKGROUND

The present disclosure relates generally to environmental monitoring and/or action within an environment using smart coatings, such as smart paints.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

As mentioned above, the present disclosure relates to environmental monitoring and action within an environment using smart coatings, such as smart paints. Specifically, smart coatings, including smart paints, may include electrically conductive materials that enable electrical charges to flow through the coatings. The present disclosure relates to using these electrical charges to monitor and/or take action within an environment. Specifically, capacitive changes within the smart coatings may indicate particular information about an object (e.g., a wall, vehicle, etc.) that may be useful to a user and/or for proactive action. For example, as capacitive changes (e.g., mutual capacitance between rows or columns of smart coatings) occur in the smart coatings, this may indicate contact with the object and/or structural weaknesses of the object. As may be appreciated, this information, when discerned, may be quite valuable. Thus, upon detection of such contact and/or structural weaknesses, a notification may be provided to electronic control systems for electronic-driven actions pertaining to the object and/or electronic notification devices to provide notification to particular interested parties.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and enterprise-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

With the preceding in mind, the following figures relate to various types of generalized system architectures, configurations, and/or techniques that may be employed to provide electronic monitoring and/or action related to impact and/or structural weakness discernable using smart coating systems.

Figure 1:
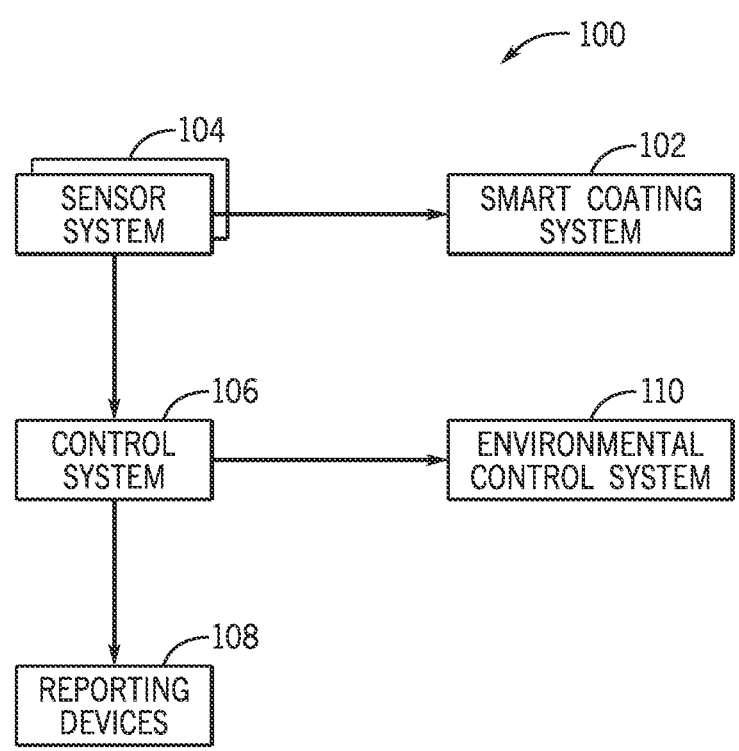
FIG. 1 is a block diagram, illustrating a system for facilitating proactive monitoring and/or action using smart coatings, in accordance with aspects of the present disclosure.

FIG. 1 is a block diagram, illustrating a system 100 for facilitating proactive monitoring and/or action using smart coatings, in accordance with aspects of the present disclosure. The system 100 includes a smart coating system 102. As will be discussed in more detail below, the smart coating system 102 may include electrically conductive material ("electrodes") forming useful measurement patterns on an object. The smart coating system 102 may further include a protective top coat over the measurement patterns and other portions of the object, creating a desired coloring, while retaining the electrical conductivity of the measurement patterns.

The system 100 may include a sensor system 104 tasked with measuring conductivity or other electrical characteristics of the smart coating system 102 to discern changes in the electrical characteristics over time. For example, an electrical current may be provided via the sensor system 104 (or other source) to the smart coating system, exciting electrical attributes (e.g., capacitance, such as mutual capacitance between electrodes of the measurement patterns): conductivity; and/or resistance) of the smart coating system 102.

The electrical attributes of the smart coating system 102 may change as characteristics associated with the electrodes of the smart coating system 102 change. For example, contact with the electrodes, by another object, may cause a capacitance change within the smart coating system 102. Further, if the structure of the object changes, this may change the shape, size, and/or location of the electrodes, which may also alter the electrical attributes. These attribute measurements may be read and recorded from the sensor system 104 by a control system 106 tasked with identifying changes in the electrical attributes over time. For example, the control system 106 may request baseline measurements be taken by the sensor system 104. The baseline measurements may be used as a comparison with subsequent measurements received from the sensor system 104 to identify changes in the electrical attributes.

Upon identifying changes in the electrical attributes that meet a threshold differential value, the control system 106 may discern a notable event with respect to the object (e.g., a wall and/or a vehicle) that the smart coating system 102 coats. The notable event may be identified as a specific type of event based upon a magnitude of change in the electrical attributes and/or a duration of the change in the electrical attributes. For example, the control system 106 may discern that the notable event is an impact (e.g., forcible contact) to the object or a structural issue based upon the duration of the change in electrical attributes. For example, the control system 106 may ascribe an electrical attribute change (e.g., a change in mutual capacitance) to an impact when the change is below a certain time threshold, as impacts are oftentimes fast-moving contacts to the object that end relatively quickly, resulting in the electrical attributes returning to near the baseline measurements relatively quickly. However, structural issues with the object may be ascribed to the event when the difference in the electrical attributes is retained or increases over a threshold period of time. Indeed, in such a scenario, this may indicate that the structure of the object and/or smart coating system 102 has changed for a long term. Further, when the differential from the baseline measurements increases, as indicated based upon the magnitude of baseline measurement compared with subsequent measurements, this may indicate a worsening structural issue.

The control system 106 may provide an electronic notification to reporting services 108 indicating that the notable event has occurred. The reporting services 108 may include an electronic device that provides a notification via a graphical interface of an electronic display, as will be discussed in more detail below.

Additionally and/or alternatively, the control system 106 may cause one or more environmental actions to occur. For example, the control system 106 may provide a control signal to an environmental control system 110 in response to identifying the notable event. For example, in one embodiment, upon identifying a notable event, a camera in proximity may be activated to capture a visual image of the object associated with the notable event. To do this, the control system 106 may provide a control signal commanding the environmental control system 110 (e.g., the camera control hardware and/or software) to activate the camera to capture an image of the object. In other instances, other computing services may be provided a control signal. For example, an automated claim initiation control signal, indicating to initiate an insurance claim, may be provided to insurance service servers, in response to detecting the notable event.

In some embodiments, the sensor system 104 may be activated based upon weather or other events that may impact structural integrity of an environment. For example, after an earthquake, a hurricane, or heavy winds, the sensor system 104 could be commanded to take readings to understand whether these events caused any structural damage. The measurements after these events could help define new thresholds/tolerances for structures, materials, etc. and could be used for may purposes, including informing of improved, future structure development.

Figure 2:
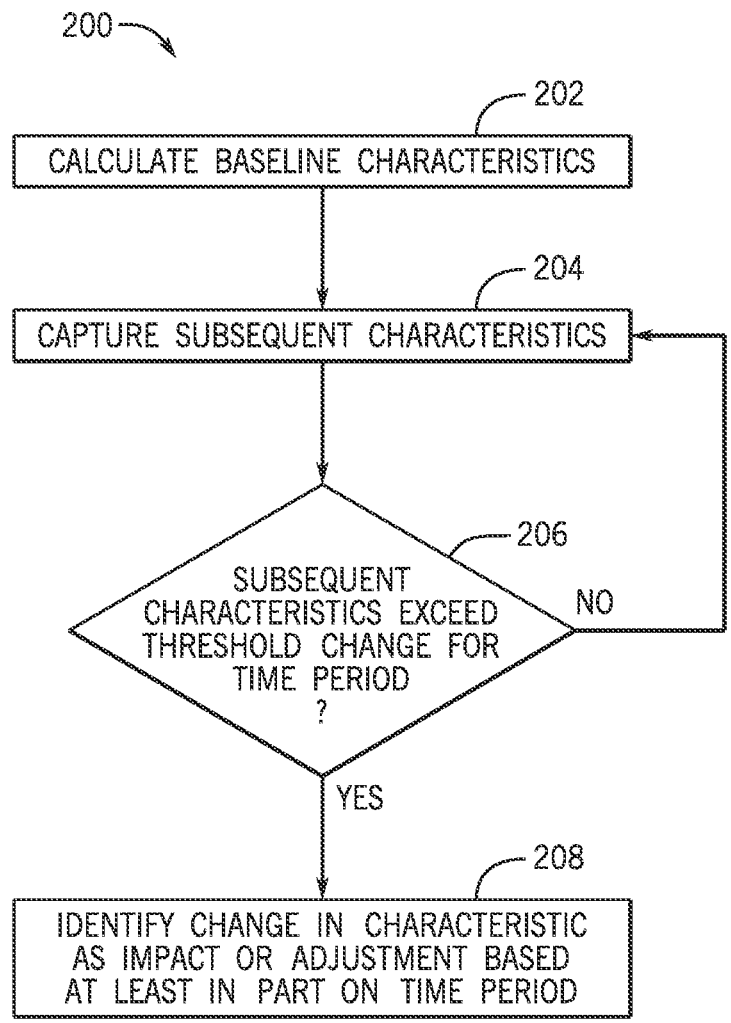
FIG. 2 is a flowchart, illustrating a process for proactively monitoring and/or performing actions using smart coatings, in accordance with aspects of the present disclosure.

Turning now to a more detailed description of the notable event detection techniques, FIG. 2 is a flowchart, illustrating a process 200 for proactively monitoring and/or performing actions using smart coatings, in accordance with aspects of the present disclosure.

The process 200 begins with calculating baseline electrical attributes/characteristics (block 202). For example, as mentioned above, mutual capacitance between electrodes of a smart coating system 102 may be measured by sensor system 104 prior to a notable event.

After the baseline attributes/characteristics are measured, subsequent measurements of these attributes/characteristics are obtained (block 204). As mentioned above, to take the baseline characteristics and the subsequent characteristics, the sensor system 104 may provide an electrical current to excite electrical attributes/characteristics that may then be measured by the sensor system 104.

As mentioned above, the subsequent attribute/characteristic measurements can be compared with the baseline attributes/characteristic measurements to determine if a notable event has occurred. For example, if a differential between the baseline and subsequent measurements breaches a threshold magnitude of change (decision block 206). In some embodiments, as depicted, there may also be an amount of time threshold that must be breached in order to identify a notable event.

Based at least in part upon the time period that the magnitude of difference breaches the threshold, the notable event may be identified as an impact or a structural change (e.g., an adjustment) (block 208).

Figure 3:
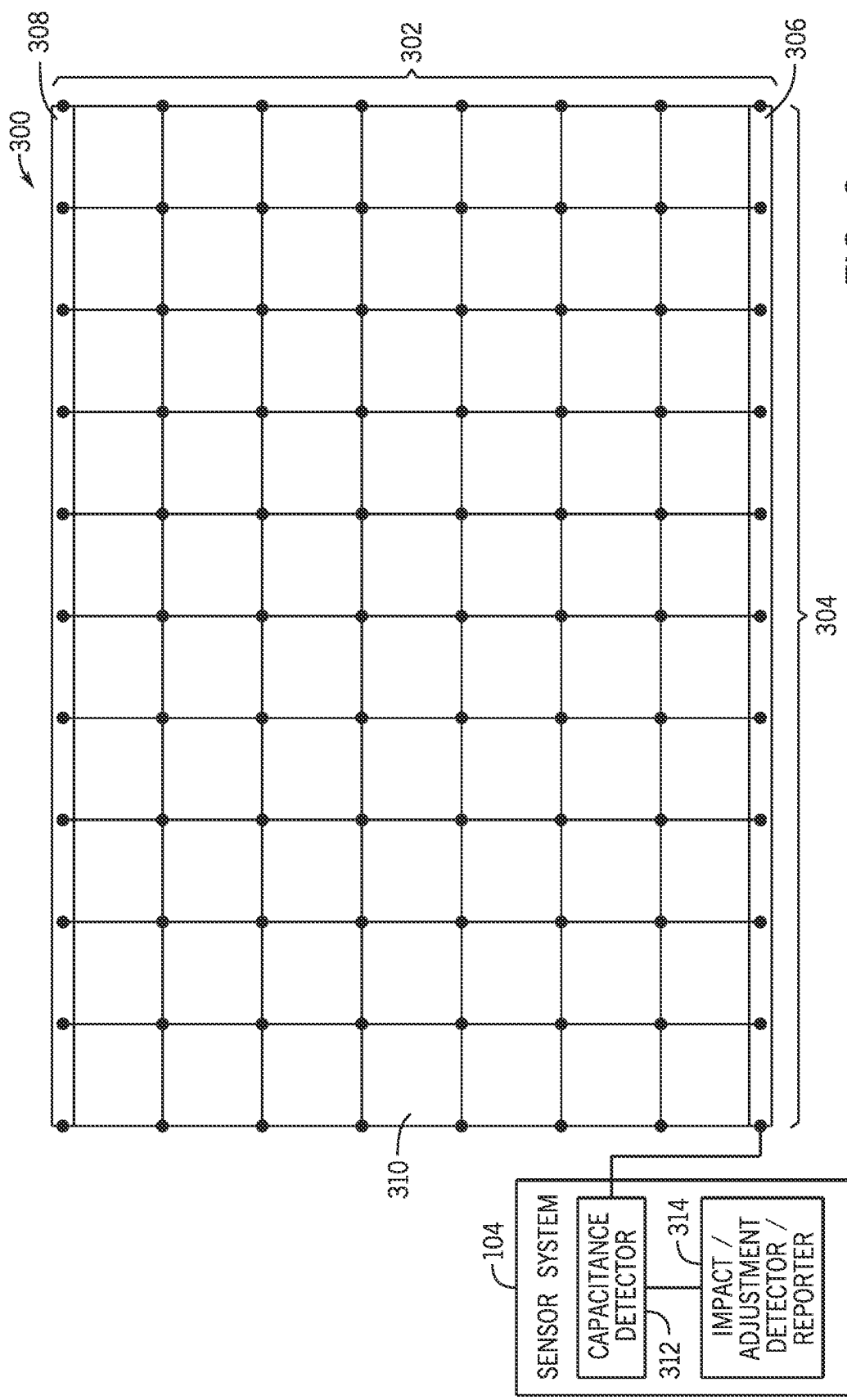
FIGS. 3 and 4 are illustrations of a wall coated with a smart coating pattern, used to proactively monitor and/or perform actions, in accordance with aspects of the present disclosure.
Figure 4:
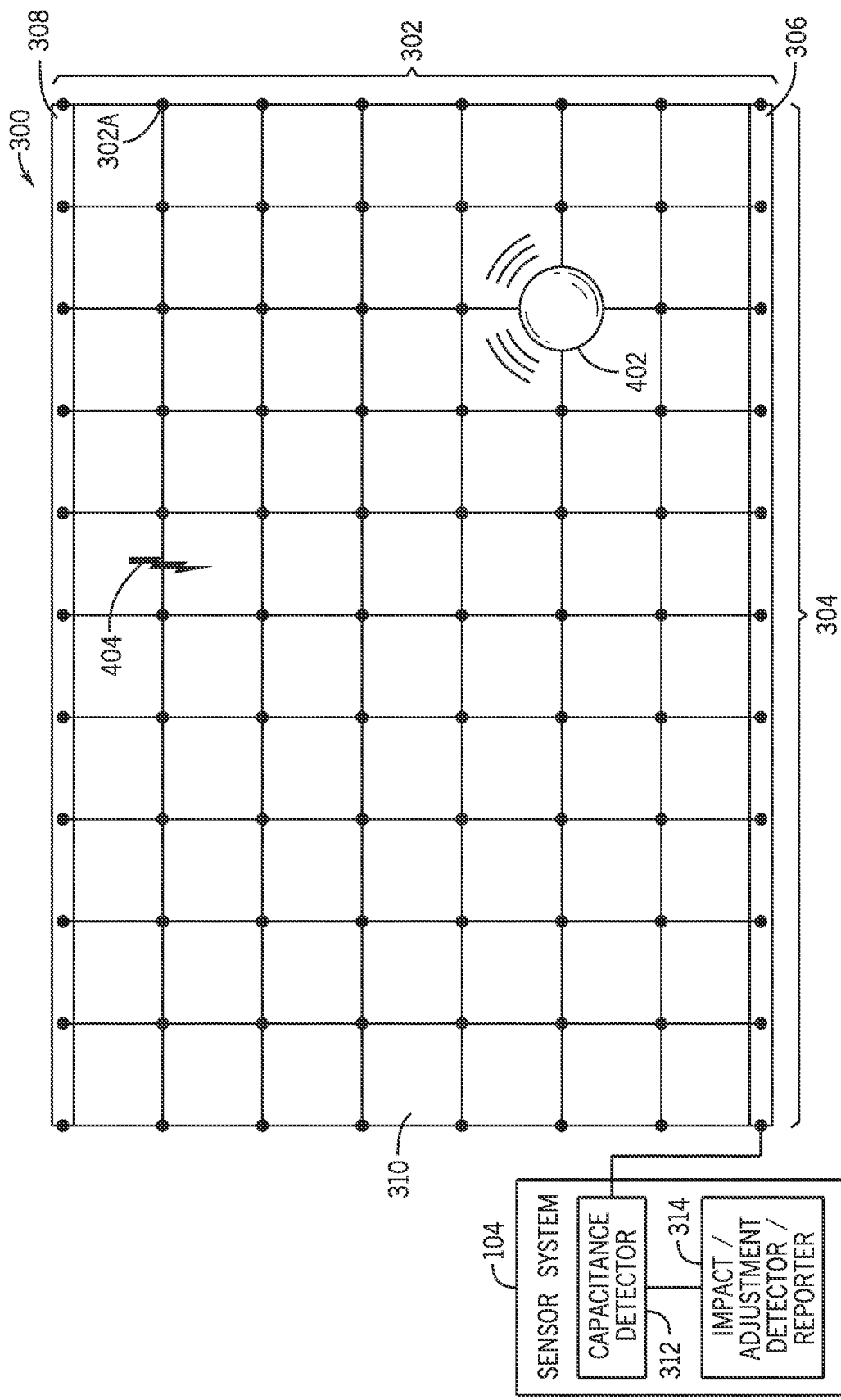

FIGS. 3 and 4 are illustrations of a wall 300 coated with a smart coating pattern, used to proactively monitor and/or perform actions, in accordance with aspects of the present disclosure. In the depicted embodiment, the pattern includes conductive rows 302 and conductive columns 304 that intersect to form a grid. Further, a protective coat may be applied on top of the pattern to protect the conductive rows 302 and conductive columns 304 and further creating a desired aesthetic that hides the conductive rows 302 and conductive columns 304 from view.

When electrical current is introduced to the conductive rows 302 and conductive columns 304, the conductive rows 302 and conductive columns 304 may produce electrical attributes that may be measurable to discern notable events of the object that the smart coating is applied to (e.g., the wall 300). For example, mutual capacitance between neighboring conductive rows 302 and/or conductive columns 304 may be measured.

To introduce the electrical current to the conductive rows 302 and conductive columns 304, a sensor system 104 may be coupled, via an electrical connection, to the conductive rows 302 and/or the conductive columns 304. The electrical connection may vary depending on the type of object being monitored. For example, in the illustrated embodiment, the object is a wall 300. Walls often times have baseboards, moldings, or other features associated with them. Accordingly, the electrical connection for wall 300 may be formed into a baseboard 306, a molding, such as crown molding 308, or other features, such as vertical molding 310 that would typically be associated with a wall 300. As illustrated, the electrical connection may couple to each of the conductive rows 302 and/or conductive columns 304, enabling the sensor system 104 to produce an electrical current to one or more of the conductive rows 302 and/or conductive columns 304.

The sensor system 104 includes a capacitance detector 312 and an impact/adjustment detector/reporter 314. The capacitance detector 312 may observe a capacitance of the smart coating pattern, which may be used by the impact/adjustment detector/reporter 314 to identify notable events. The capacitance identified by the capacitance detector 312 may include capacitance of one or more of the conductive rows 302 and/or conductive columns 304 or maybe a mutual capacitance between certain conductive rows 302 and/or conductive columns 304. In FIG. 3, the sensor system 104 is measuring the baseline measurements of electrical attributes of the smart coating (e.g., capacitance) prior to a notable event occurring. As mentioned herein, the baseline measurements may be compared with subsequent measurements to identify notable events.

In FIG. 4, the sensor system 104 takes one or more subsequent measurements of the electrical attributes, while and/or after one or more notable events has occurred. In the illustrated example of FIG. 4, a ball 402 has made contact with the wall 300 and a structural modification (e.g., crack 404) has formed in the wall 300. These notable events may modify the electrical attributes of the smart coating of the wall 300. For example, the contact of the ball 402 may modify a capacitance of nearby conductive rows 302 and/or conductive columns 304 for a certain time period after the contact. The electrical attributes may return to near the baseline measurements after the certain time period. Accordingly, the impact/adjustment detector/reporter 314 may discern temporal contact/impact with the wall 300, based upon the subsequent measurements of the electrical attributes changing by a threshold amount and then returning to near baseline measurements over time.

More permanent changes in the wall 300 may also be detected and/or distinguished from temporal events occurring at the wall 300. For example, the crack 404 forming in the wall 303 may be a persistent event, unless remedial measures are taken to repair the crack 404. The impact/adjustment detector/reporter 314 may identify/distinguish these types of notable events from temporal events (e.g., impact from the ball 402) by identifying that a threshold change in electrical attributes is maintained (e.g., does not return by at least a threshold amount to the baseline measurements) for a particular threshold amount of time. This can be done by taking a number of subsequent measurements over the threshold amount of time. In some embodiments, upon initial detection of a notable event, the sensor system 104 may be controlled (e.g., via electronic commands) to increase a frequency of measurement capture for a time period, in an effort to distinguish long-term (e.g., more permanent) events from short-term (temporal) events. Further, in some instances, structural and/or more long-term events may result in more significant changes in the electrical attributes than relatively shorter events. For example, the crack 404 may result in loss of conductivity in a portion of the pattern of the smart coating, when decoupling one portion of the pattern from another. In FIG. 4, for example, the crack 404 separates portions of a conductive row 302A, which may cause a portion of that row to lose conductivity. This may affect the electrical attributes in a significant way, by significantly changing the capacitance to a greater magnitude than a temporal contact with the row. Accordingly, upon detecting a change in electrical attributes above a certain structural measurement threshold, an event may be discerned as structural and/or long-term independent of and/or in addition to detecting that the change in electrical attributes is maintained for a threshold time.

Further, the pattern of the smart coating may be used to help pinpoint a location, on the object, where the event occurred. To do this, electrical attribute measurements may be ascribed to each of (or groupings of) the conductive rows 302 and/or conductive columns 304. In this manner, electrical attribute changes may be ascribed to particular rows and/or columns and/or groups of particular rows and/or columns, which may provide a grid location of the changes and, thus, the notable event. For example, in FIG. 4, the loss of conductivity in the row 302A may result in a detectable lack of electrical current flowing back to the sensor system 104 and/or significant changes in capacitance of the nearby rows and/or columns. Similarly, the ball 402, upon contact with the wall 300 may cause a shift in electrical attributes in the rows and/or columns near the contact point. Accordingly, locations of the crack 404 and/or ball 402 contact may be discerned by identifying the particular conductive rows 302 and/or conductive columns 304 that experience the electrical attribute change.

Figure 5:
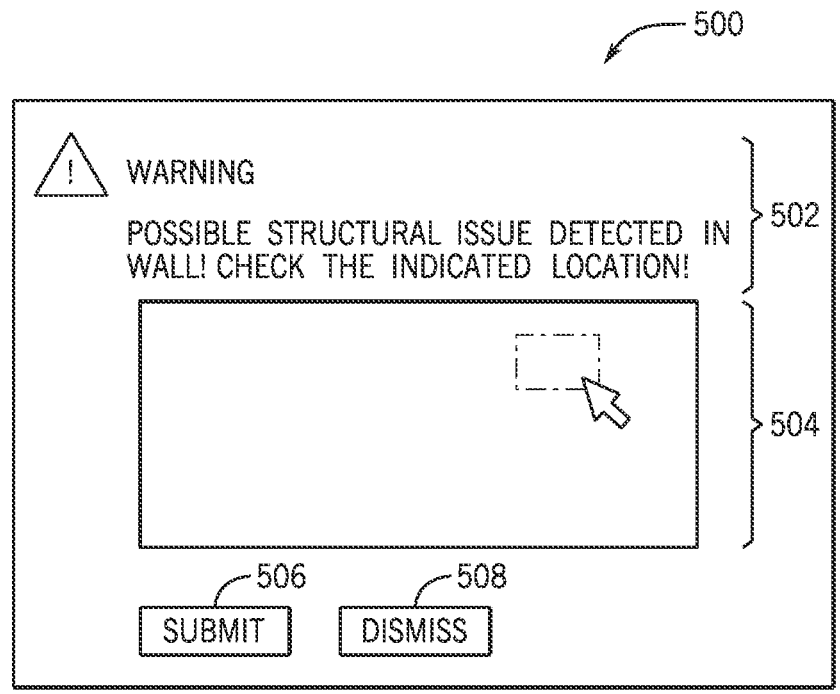
FIGS. 5 and 6 are schematic diagrams, illustrating a graphical user interface output from the system of claim 1, in accordance with aspects of the present disclosure.
Figure 6:
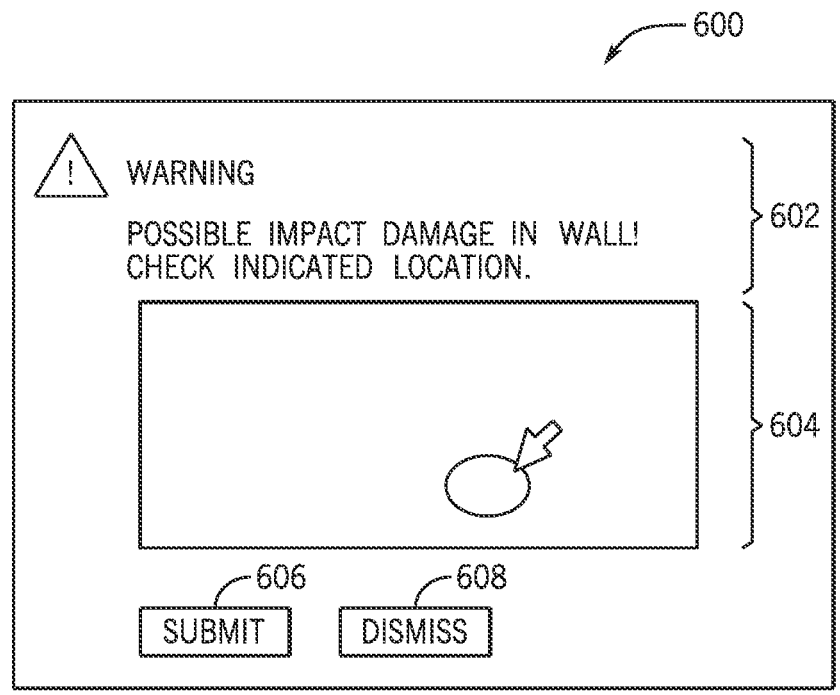

As mentioned herein, a notification may be provided upon detecting notable events associated with objects. For example, users and/or electronic services may subscribe to notable event notifications pertaining to particular objects of interest. Upon detecting notable events associated with these objects, subscribers to notable event data may be provided an electronic signal indicating the detected notable events. FIGS. 5 and 6 are schematic diagrams, illustrating a graphical user interface output from the system of claim 1, in accordance with aspects of the present disclosure. In FIG. 5, a graphical user interface (GUI) 500 is rendered based upon received notable event data (e.g., a type of event, location of the event, etc.). The GUI 500 in the current embodiment, includes an indication 502 of the particular type of notable event (e.g., a structural and/or long-term event). Further, the GUI 500 includes an indication 504 of a location, on the object, where the notable event has occurred. The GUI 500 includes an affordance 506 to submit reporting of notable event to a downstream service (e.g., to an insurance company for automatic claim initiation, to a maintenance company for a repair request, to an owner of the object for notification purposes, etc.). The GUI 500 also includes an affordance 508 that enables dismissal of the notification, such that it is not further reported (at least for a certain amount of time or until a subsequent threshold amount of change in electrical attributes is detected, indicating a change in the notable event).

FIG. 6 is a similar GUI 600, this time reporting a shorter-term notable event (e.g., the ball contacting/impacting the wall 300). As with the GUI 500, the GUI 600 includes an indication 602 of the type of notable event (e.g., impact or short-term) and an indication 604 of location, on the object, where the notable event occurred.

As mentioned above, the control system 106 of FIG. 1 may command one or more environmental control systems 110 upon detecting notable events. To facilitate more detailed data in the GUIs 500 and 600, for example, the control system 106 may command a camera system with visibility to the object (wall 300) to capture an image of the object upon detecting the notable event. In this manner, the indication 504 and 604 may include an image of the object along with an emphasized location on the object where the notable event was detected. This emphasized location may be presented, for example, via an overlain indication (e.g., dashed box, etc.) at the detected location on the object.

Figure 7:
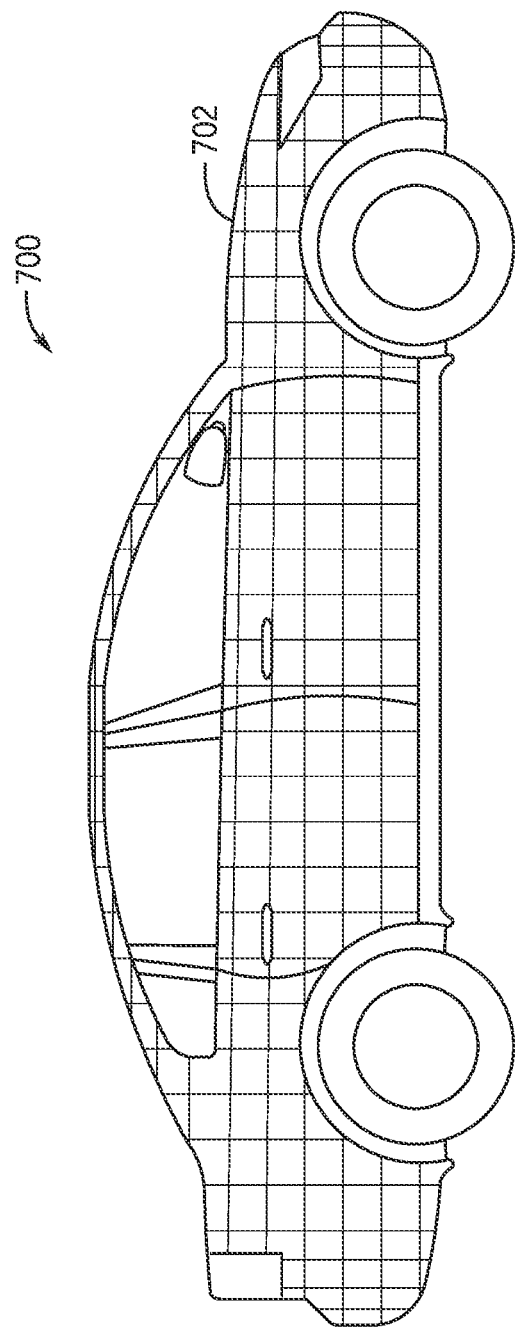
FIG. 7 is a schematic diagram illustrating the smart coating on a vehicle, in accordance with aspects of the present disclosure.

While the preceding examples have primarily focused on a wall of a structure, it is important to note that the systems and techniques could be useful with respect to many other types of objects. For example, FIG. 7 is a schematic diagram illustrating a vehicle 700, in accordance with aspects of the present disclosure. Similar to the wall 300, the vehicle 700 includes an electrically conductive pattern 702 that may be used to discern notable events as described herein. As illustrated, the conductive pattern 702 may be in the form of a grid that follows the curvature of the vehicle body. In other embodiments, the pattern of the smart coating system may include stripes and/or other shapes suitable for discerning particular types of notable events for particular objects.

As may be appreciated, the presently described systems and techniques enable computers to discern impacts and structural weaknesses in objects in a new and cost-effective manner. As capacitive changes (e.g., mutual capacitance between rows or columns of smart coatings) occur in the smart coatings, contact with the object and/or structural weaknesses of the object may be identified, enabling electronic notification and/or action to occur in response to the contact and/or structural weakness.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system, comprising:
a conductive paint disposed on an object to be monitored for a contact event, structural change event, or both; and
a sensor system, configured to:
measure, at a first time, an electrical attribute of the conductive paint, as a baseline electrical attribute measurement;
measure, at a second time, the electrical attribute of the conductive paint, as a subsequent electrical attribute measurement;
determine a magnitude of a change between the baseline electrical attribute measurement and the subsequent electrical attribute measurement;
when the magnitude of the change breaches a pre-defined event threshold, determine an event has occurred;
determine whether the event is a contact event or a structural event by:
identifying whether, within a prescribed time period the change reduces to or below a prescribed threshold;
when the change reduces to or below the prescribed threshold within the prescribed time period, ascribing the event to a contact event;
otherwise, when the change does not reduce to or below the prescribed threshold within the prescribed time period, ascribing the event to a structural event; and
provide an indication that the contact event, structural change event, or both has occurred to an electronic device.

2. The system of claim 1, comprising the electronic device, wherein the electronic device comprises a control system configured to:
in response to receiving the indication that the contact event, structural change event, or both has occurred:
report an occurrence of the contact event, structural change event, or both;
provide a control command to an environmental control system; or
both.

3. The system of claim 2, wherein the environmental control system comprises a camera system with visibility to the object.

4. The system of claim 1, wherein the conductive paint is disposed in a conductive pattern on the object.

5. The system of claim 4, wherein the conductive pattern comprises a grid of conductive rows and conductive columns.

6. The system of claim 5, wherein the sensor system is configured to identify a location of occurrences of the contact event, structural change event, or both by identifying particular ones of the conductive rows, the conductive columns, or both that experience the change between the baseline electrical attribute measurement and the subsequent electrical attribute measurement.

7. The system of claim 1 wherein the electrical attribute comprises a capacitance of the conductive paint, a mutual capacitance between portions of the conductive paint, or both.

8. The system of claim 1 wherein the electrical attribute comprises an electrical current.

9. The system of claim 1, wherein the object comprises a wall, a vehicle, or both.

10. The system of claim 1, wherein the prescribed threshold comprises the pre-defined event threshold.

11. A method, comprising:
measuring, at a first time, an electrical attribute of conductive paint disposed on an object to be monitored for a contact event, structural change event, or both, as a baseline electrical attribute measurement;
measuring, at a second time, the electrical attribute of the conductive paint, as a subsequent electrical attribute measurement;
determining a magnitude of a change between the baseline electrical attribute measurement and the subsequent electrical attribute measurement;
when the magnitude of the change breaches a pre-defined event threshold, determining an event has occurred;

determining whether the event is a contact event or a structural event by:
  identifying whether, within a prescribed time period the change reduces to or below a prescribed threshold;
  when the change reduces to or below the prescribed threshold within the prescribed time period, ascribing the event to a contact event;
  otherwise, when the change does not reduce to or below the prescribed threshold within the prescribed time period, ascribing the event to a structural event; and
providing an indication that the contact event, structural change event, or both has occurred to an electronic device.

12. The method of claim 11, wherein the electrical attribute comprises a capacitance of the conductive paint, a mutual capacitance between portions of the conductive paint, an electrical current, or any combination thereof.

13. The method of claim 11, comprising:
causing reporting of an occurrence of the contact event, structural change event, or both;
causing provision of a control command to an environmental control system; or
both.

14. The method of claim 11, wherein:
the conductive paint is disposed in a conductive pattern on the object, the conductive pattern comprising a grid of conductive rows and conductive columns; and
the method comprising:
  identifying a location of occurrences of the contact event, structural change event, or both by identifying particular ones of the conductive rows, the conductive columns, or both that experience the change between the baseline electrical attribute measurement and the subsequent electrical attribute measurement.

15. A tangible, non-transitory, computer-readable medium, comprising computer-readable instructions that, when executed by circuitry, causes the circuitry to:
measure, at a first time, an electrical attribute of conductive paint disposed on an object to be monitored for a contact event, structural change event, or both, as a baseline electrical attribute measurement;
measure, at a second time, the electrical attribute of the conductive paint, as a subsequent electrical attribute measurement;
determine a magnitude of a change between the baseline electrical attribute measurement and the subsequent electrical attribute measurement;
when the magnitude of the change breaches a pre-defined event threshold, determine an event has occurred;
determine whether the event is a contact event or a structural event by:
  identifying whether, within a prescribed time period the change reduces to or below a prescribed threshold;
  when the change reduces to or below the prescribed threshold within the prescribed time period, ascribing the event to a contact event;
  otherwise, when the change does not reduce to or below the prescribed threshold within the prescribed time period, ascribing the event to a structural event; and
provide an indication that the contact event, structural change event, or both has occurred to an electronic device.

16. The computer-readable medium of claim 15, wherein the electrical attribute comprises a capacitance of the conductive paint, a mutual capacitance between portions of the conductive paint, an electrical current, or any combination thereof.

17. The computer-readable medium of claim 15, comprising computer-readable instructions that, when executed by the circuitry, causes the circuitry to:
identify a location of occurrences of the contact event, structural change event, or both by identifying particular conductive rows, conductive columns, or both of the conductive paint that experience the change between the baseline electrical attribute measurement and the subsequent electrical attribute measurement.

* * * * *